US010457543B2

(12) United States Patent
Morita et al.

(10) Patent No.: US 10,457,543 B2
(45) Date of Patent: Oct. 29, 2019

(54) ELECTROSTATIC ACTUATOR AND SWITCH

(71) Applicant: SONY CORPORATION, Tokyo (JP)

(72) Inventors: Shinya Morita, Tokyo (JP); Koichi Ikeda, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 269 days.

(21) Appl. No.: 15/542,779

(22) PCT Filed: Nov. 27, 2015

(86) PCT No.: PCT/JP2015/083447
§ 371 (c)(1),
(2) Date: Jul. 11, 2017

(87) PCT Pub. No.: WO2016/121214
PCT Pub. Date: Aug. 4, 2016

(65) Prior Publication Data
US 2017/0369303 A1 Dec. 28, 2017

(30) Foreign Application Priority Data
Jan. 30, 2015 (JP) ................. 2015-016773

(51) Int. Cl.
*H02N 1/08* (2006.01)
*H01L 29/36* (2006.01)
(Continued)

(52) U.S. Cl.
CPC .......... *B81B 3/0021* (2013.01); *B81B 3/0016* (2013.01); *H01H 59/0009* (2013.01);
(Continued)

(58) Field of Classification Search
CPC . H02N 1/00; H02N 1/004; H02N 1/08; B81B 3/0002; B81B 3/0008;
(Continued)

(56) References Cited

U.S. PATENT DOCUMENTS 5,428,259 A * 6/1995 Suzuki .................. B81B 3/0021
310/309
5,572,057 A * 11/1996 Yamamoto .......... G01P 15/0802
257/417

(Continued)

FOREIGN PATENT DOCUMENTS

AU 2003254882 A1 2/2005
DE 10200873 A1 8/2002
(Continued)

OTHER PUBLICATIONS

International Search Report and Written Opinion of PCT Application No. PCT/JP2015/083447, dated Feb. 16, 2016, 2 pages of English Translation and 5 pages of ISRWO.

*Primary Examiner* — Edgardo San Martin
(74) *Attorney, Agent, or Firm* — Chip Law Group

(57) ABSTRACT

An electrostatic actuator includes a base, a movable electrode including a semiconductor and supported to the base to be displaceable in a first direction, and a fixed electrode including the semiconductor and fixed to the base, in which the fixed electrode faces the movable electrode in a state of being separated therefrom in the first direction. The electrostatic actuator includes a high-resistance region formed in at least a portion of each of respective facing surfaces of the movable electrode and the fixed electrode, and lower in impurity concentration than a surrounding region thereof.

12 Claims, 8 Drawing Sheets

(51) Int. Cl.
*H02N 1/00* (2006.01)
*B81B 3/00* (2006.01)
*H01H 59/00* (2006.01)
*H01L 29/02* (2006.01)

(52) U.S. Cl.
CPC ............... *H02N 1/00* (2013.01); *H02N 1/008* (2013.01); *B81B 3/0013* (2013.01); *B81B 2201/018* (2013.01); *B81B 2201/033* (2013.01); *B81B 2203/04* (2013.01); *B81B 2203/051* (2013.01)

(58) Field of Classification Search
CPC ... B81B 3/0021; B81B 3/0016; B81B 3/0013; H01H 59/00; H01H 59/0009; H01H 2059/0072; H01L 29/34; H01L 29/36; H01L 29/365; H01L 29/30; G01P 15/125
See application file for complete search history.

(56) References Cited

U.S. PATENT DOCUMENTS

| | | | | |
|---|---|---|---|---|
| 6,265,758 | B1 * | 7/2001 | Takahashi | H02N 1/004 257/637 |
| 6,992,551 | B2 * | 1/2006 | Shimizu | H01H 59/0009 200/181 |
| 7,275,435 | B2 * | 10/2007 | Sugiura | G01C 19/5719 73/504.14 |
| 8,368,196 | B2 * | 2/2013 | Akashi | B81B 3/001 257/686 |
| 8,619,003 | B2 * | 12/2013 | Dairiki | H01L 21/6835 257/723 |
| 9,130,012 | B2 * | 9/2015 | Yamaguchi | B81C 3/008 |
| 2002/0104377 | A1 | 8/2002 | Ishio | |
| 2009/0267445 | A1 | 10/2009 | Mizuno et al. | |
| 2010/0194407 | A1 * | 8/2010 | Nakatani | G01P 15/0802 324/660 |
| 2010/0213789 | A1 * | 8/2010 | Igarashi | B81B 3/0008 310/300 |

FOREIGN PATENT DOCUMENTS

| | | |
|---|---|---|
| JP | 06-347474 A | 12/1994 |
| JP | 2002-228680 A | 8/2002 |
| JP | 2009-113128 A | 5/2009 |
| WO | 2005/015595 A1 | 2/2005 |
| WO | 2009-113128 A1 | 5/2009 |

* cited by examiner

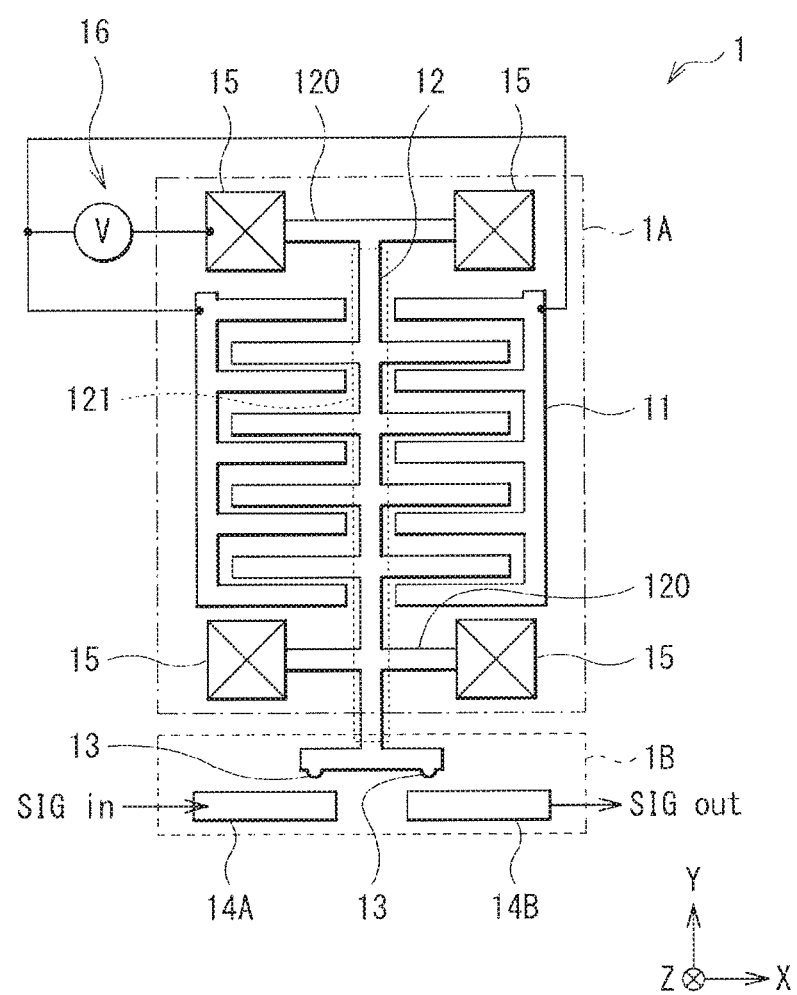
[FIG. 1]

[ FIG. 2A ]
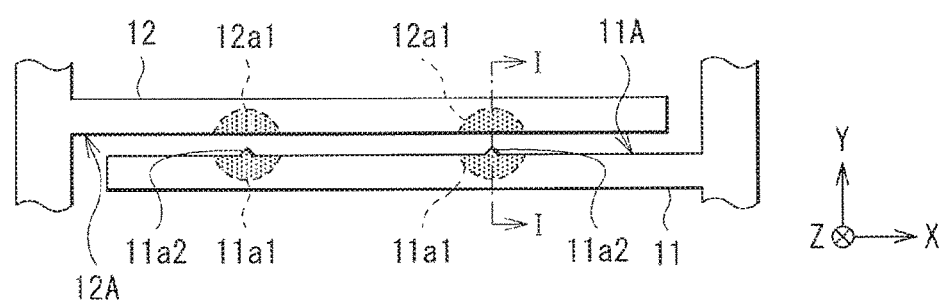
[ FIG. 2B ]
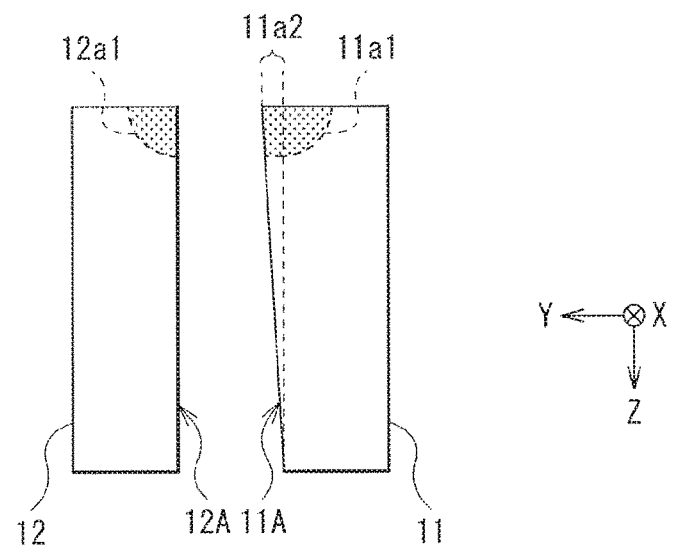

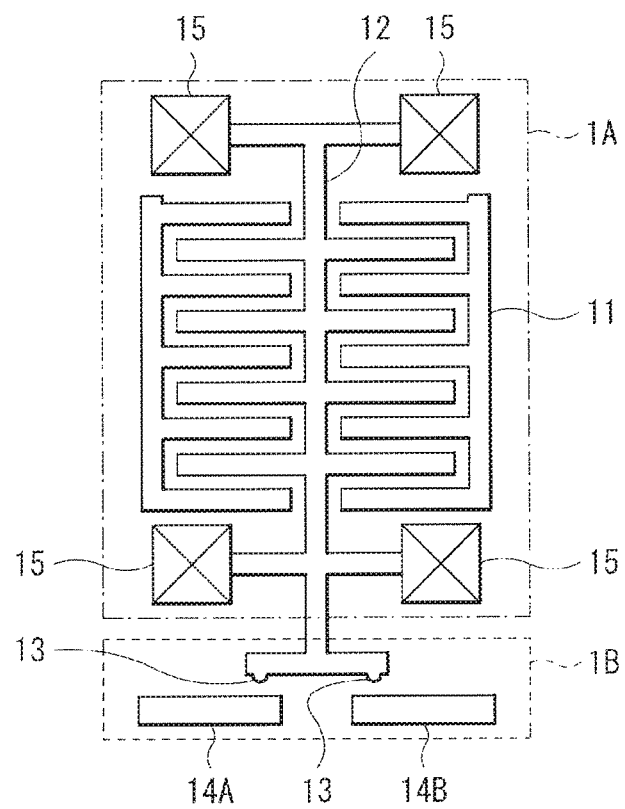
[ FIG. 3A ]

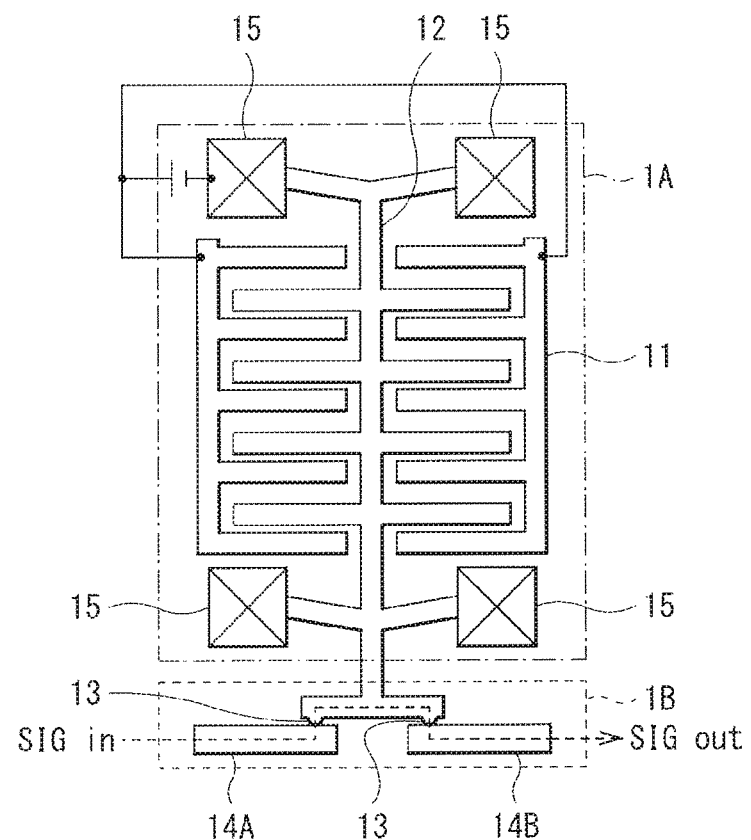
[ FIG. 3B ]

[ FIG. 4 ]
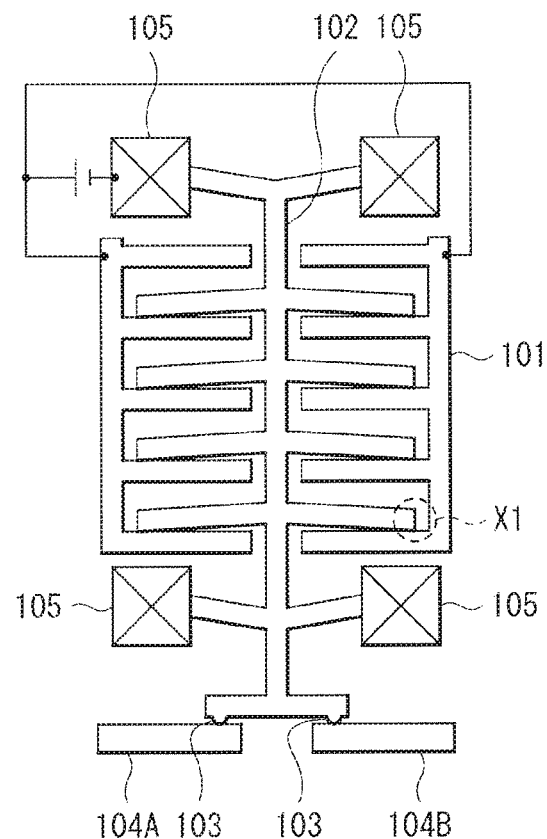
[ FIG. 5 ]
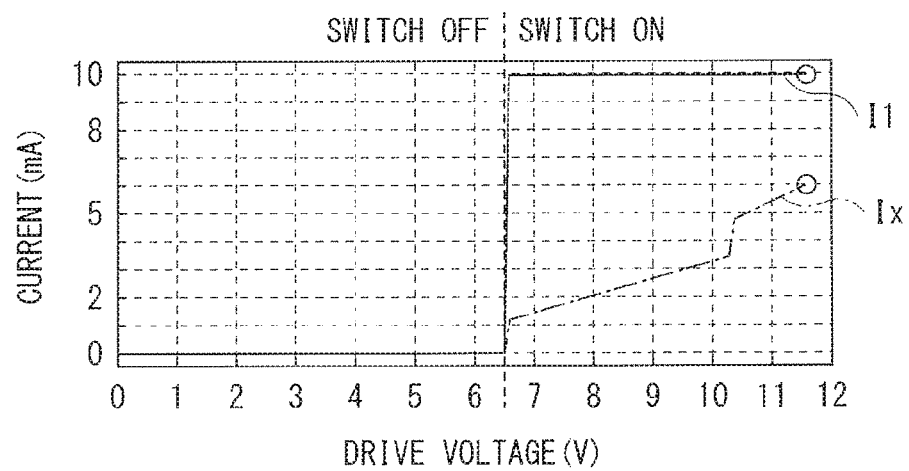

[ FIG. 6 ]
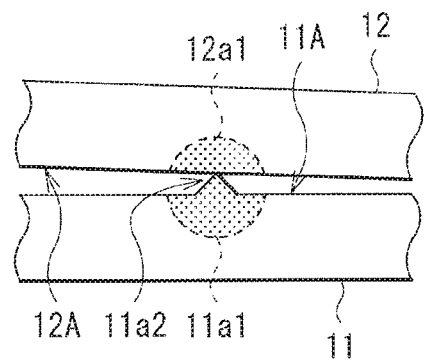
[ FIG. 7 ]
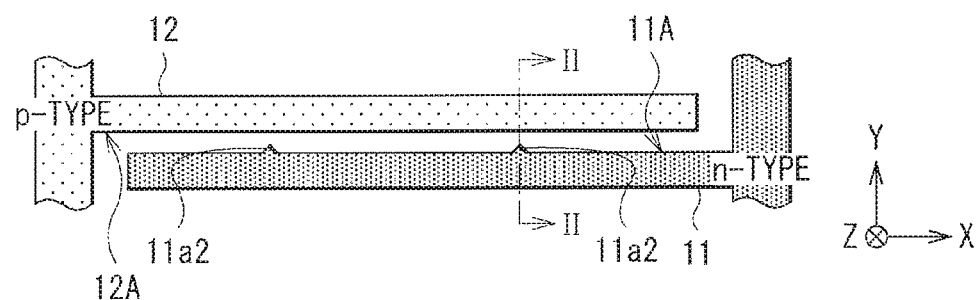
[ FIG. 8 ]
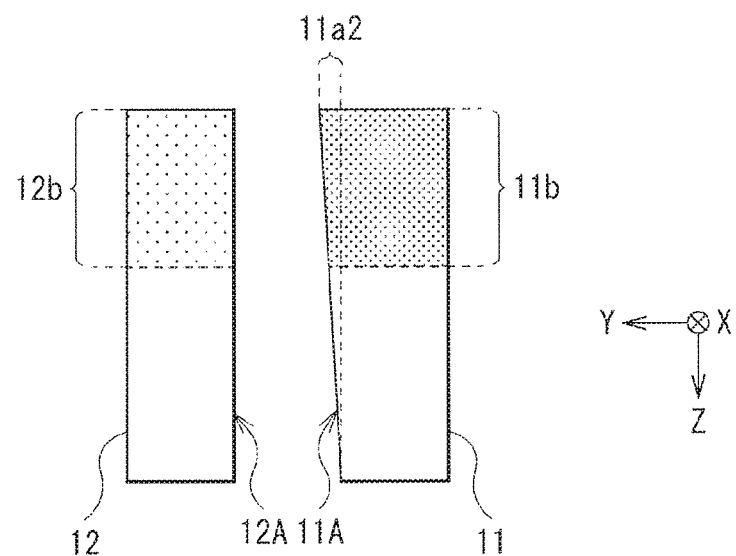

[ FIG. 9 ]
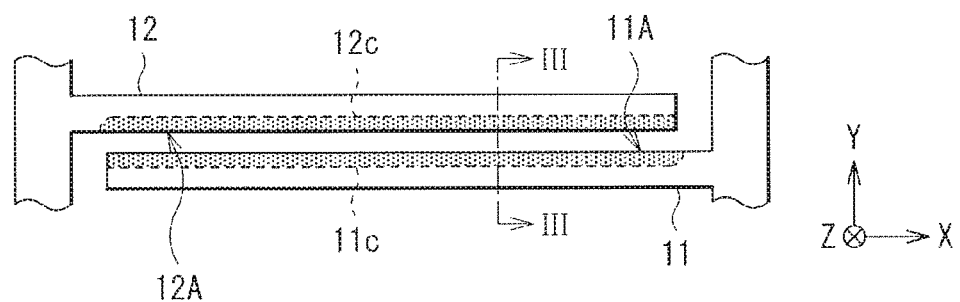
[ FIG. 10 ]
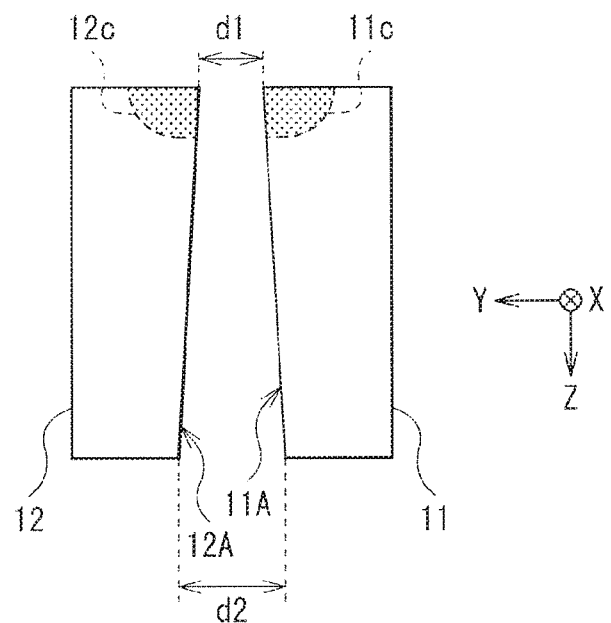

[ FIG. 11 ]
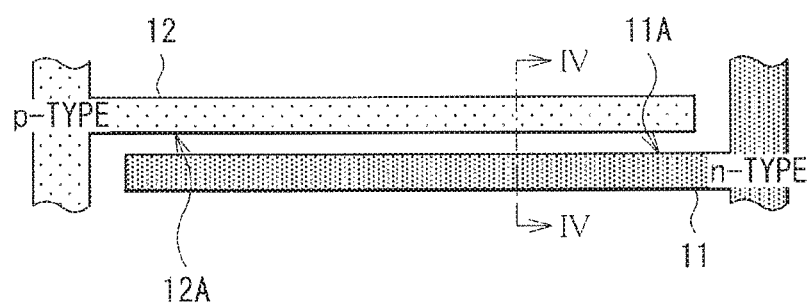
[ FIG. 12 ]
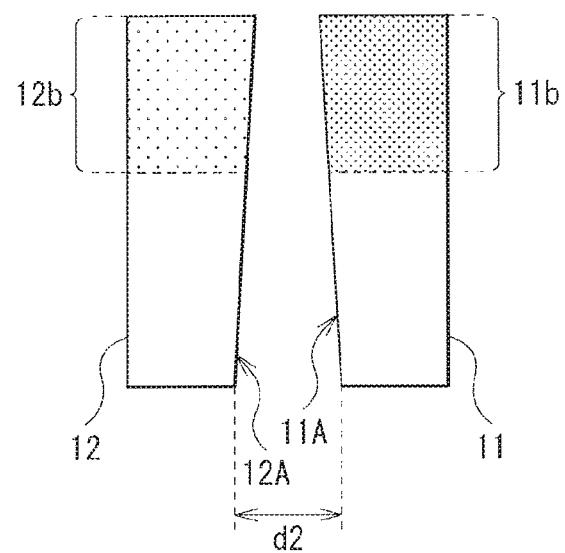

ELECTROSTATIC ACTUATOR AND SWITCH

CROSS REFERENCE TO RELATED APPLICATIONS

This application is a U.S. National Phase of International Patent Application No. PCT/JP2015/083447 filed on Nov. 27, 2015, which claims priority benefit of Japanese Patent Application No. JP 2015-016773 filed in the Japan Patent Office on Jan. 30, 2015. Each of the above-referenced applications is hereby incorporated herein by reference in its entirety.

TECHNICAL FIELD

The disclosure relates to an electrostatic drive type MEMS (Micro Electro Mechanical System) and relates to an electrostatic actuator utilizing electrostatic force (electrostatic attraction) and a switch using this electrostatic actuator.

BACKGROUND ART

An electrostatic drive type MEMS switch is a mechanical switch that makes switch between an on (ON) state and an off (OFF) state by physical contact and has a feature of having isolation, linearity and high voltage endurance that are higher than those of a semiconductor switch. In this MEMS switch, contacts are brought into contact with each other by giving a potential difference between a movable electrode and a fixed electrode and driving the actuator by the electrostatic attraction. Thereby, it becomes possible to change over the switch to the ON state.

In general, the electrostatic actuator has such an issue that a drive voltage thereof is large. It is effective to increase facing areas of the electrodes or to reduce a distance (a gap) between the electrodes in order to reduce the drive voltage without changing the electrostatic attraction (driving force) between the electrodes (between the movable electrode and the fixed electrode). The number of electrodes may be increased by arranging the electrodes in parallel with one another in order to increase the facing areas of the electrodes. However, if the number of the electrodes is increased, arrangement area (layout area) will be increased and therefore a device size will be increased. That is, the number of the electrodes and the device size are in a trade-off relation. On the other hand, in a case where the gap between the electrodes has been reduced, it becomes easy for the electrodes to come into contact with each other when operating the switch. This is because the electrodes themselves undergo a deflection by receiving the electrostatic attraction. When the contact between the electrodes occurs, energy loss caused by current leakage and malfunction caused by adhesion (stiction or sticking) between contact portions thereof occur. These factors cause a reduction in reliability. In addition, it is effective to increase rigidity of the electrodes for avoiding the contact between the electrodes. However, thickening the electrodes leads to an increase in arrangement area and therefore a trade-off occurs between low-voltage driving and the device size also in this case.

What is desired is to suppress the current leakage and the sticking caused by the contact between the electrodes and to make the gap between the electrode as narrow as possible in order to achieve the low-voltage driving without increasing the device size in the electrostatic drive type MEMS actuator (the electrostatic actuator) in this way.

PTL 1 proposes a method of providing projections on the electrodes so as to avoid the sticking when the electrodes come into contact with each other.

CITATION LIST

Patent Literature

PTL 1: Japanese Unexamined Patent Application Publication No. H06-347474

SUMMARY OF THE INVENTION

However, although occurrence of sticking is suppressed by a method according to the above-described PTL 1, it is not possible to suppress current leakage. In addition, there are cases where the vicinity of contact points melts by current concentration and this consequently leads to the sticking. It is desired to achieve a device structure that makes low-voltage driving possible without increasing a device size.

Therefore, it is desirable to provide an electrostatic actuator that is able to achieve low voltage driving without increasing a device size and a switch provided with such an electrostatic actuator.

A first electrostatic actuator according to one embodiment of the disclosure includes a base, a movable electrode including a semiconductor and supported to the base to be displaceable in a first direction, and a fixed electrode including the semiconductor and fixed to the base, in which the fixed electrode faces the movable electrode in a state of being separated therefrom in the first direction. The first electrostatic actuator includes a high-resistance region formed in at least a portion of each of respective facing surfaces of the movable electrode and the fixed electrode, and lower in impurity concentration than a surrounding region thereof.

A first switch according to one embodiment of the disclosure is provided with the first electrostatic actuator according to one embodiment of the above-described disclosure.

In the first electrostatic actuator and switch according to one embodiment of the disclosure, at least the portion of each of the facing surfaces of the movable electrode and the fixed electrode is formed with the high-resistance region that is lower in impurity concentration than the surrounding region thereof. In such a configuration, when a voltage is applied between the movable electrode and the fixed electrode, the movable electrode is displaced in the first direction by electrostatic force thereof (driving force is generated). On this occasion, even in a case where the movable electrode and the fixed electrode have come into contact with each other, contact via the high-resistance regions is made and it becomes difficult for a leakage current to flow through contact portions concerned.

A second electrostatic actuator according to one embodiment of the disclosure includes a base, a movable electrode including a semiconductor and supported to the base to be displaceable in a first direction, and a fixed electrode including a semiconductor and fixed to the base, in which the fixed electrode faces the movable electrode in a state of being separated therefrom in the first direction. The movable electrode includes a first conductivity type semiconductor in at least a portion of a facing surface that faces the fixed electrode, and the fixed electrode includes a second conductivity type semiconductor in a region, facing the first conductivity type semiconductor, of a facing surface that faces the movable electrode.

A second switch according to one embodiment of the disclosure is provided with the second electrostatic actuator according to one embodiment of the above-described disclosure.

In the second electrostatic actuator and switch according to one embodiment of the disclosure, the movable electrode includes the first conductivity type semiconductor in at least the portion of the facing surface that faces the fixed electrode, and the fixed electrode includes the second conductivity type semiconductor in the region, facing the first conductivity type semiconductor, of the facing surface that faces the movable electrode. In such a configuration, when the voltage is applied between the movable electrode and the fixed electrode, the movable electrode is displaced in the first direction by electrostatic force thereof (the driving force is generated). On this occasion, even in a case where the movable electrode and the fixed electrode have come into contact with each other, the first conductivity type semiconductor and the second conductivity type semiconductor come into contact with each other on the contact portions thereof, forming, for example, a P-N junction diode. Thus, it becomes difficult for the leakage current to flow through the contact portions.

According to the first electrostatic actuator and switch of one embodiment of the disclosure, at least the portion of each of the facing surfaces of the movable electrode and the fixed electrode is formed with the high-resistance region that is lower in impurity concentration than the surrounding region thereof. Therefore, even in a case where the movable electrode and the fixed electrode have come into contact with each other, it is possible to suppress current leakage which would occur through the contact portions thereof. It is possible to suppress the current leakage caused by the contact of them in this way also in a case of occurrence of mutual contact of the electrodes. Therefore, it becomes possible to more reduce the distance between the movable electrode and the fixed electrode and to increase the number of the electrodes (miniaturization of the electrode becomes possible). Consequently it becomes possible to achieve low-voltage driving without increasing a device size.

According to the second electrostatic actuator and switch of one embodiment of thee disclosure, the movable electrode includes the first conductivity type semiconductor in at least the portion of the facing surface that faces the fixed electrode and the fixed electrode includes the second conductivity type semiconductor in the region, facing the first conductivity type semiconductor, of the facing surface that faces the movable electrode. Therefore, even in a case where the movable electrode and the fixed electrode have come into contact with each other, it is possible to suppress the current leakage which would occur through the contact portions thereof. It is possible to suppress the current leakage caused by the contact in this way also in a case of occurrence of the mutual contact of the electrodes. Therefore, it becomes possible to more reduce the distance between the movable electrode and the fixed electrode and to increase the number of the electrodes (the miniaturization of the electrode becomes possible). Consequently, it becomes possible to achieve the low-voltage driving without increasing the device size.

Incidentally, the above-mentioned contents are one example of the disclosure. Effects of the disclosure are not limited to the above-described ones and may be other different effects and may include further other effects.

BRIEF DESCRIPTION OF THE DRAWINGS

FIG. 1 is a schematic plan view illustrating a configuration of a MEMS switch according to a first embodiment of the disclosure.

FIG. 2A is a schematic diagram illustrating detailed configurations of a movable electrode and a fixed electrode illustrated in FIG. 1.

FIG. 2B is a cross-sectional view on arrow along the I-I line in FIG. 2A.

FIG. 3A is a schematic diagram illustrating an operation (in an OFF state) of the MEMS switch illustrated in FIG. 1.

FIG. 3B is a schematic diagram illustrating an operation (in an ON state) of the MEMS switch illustrated in FIG. 1.

FIG. 4 is a schematic diagram illustrating an operation (in an ON state) of an MEMS switch according to a comparative example.

FIG. 5 is a characteristic diagram describing current leakage that would occur in the MEMS switch illustrated in FIG. 4.

FIG. 6 is a schematic diagram illustrating, in an enlarged fashion, contact (coming-close) portions in the MEMS switch illustrated in FIG. 1.

FIG. 7 is a schematic plan view illustrating configurations of a movable electrode and a fixed electrode of an MEMS switch according to a second embodiment of the disclosure.

FIG. 8 is a cross-sectional view on arrow along the II-II line in FIG. 7.

FIG. 9 is a schematic plan view illustrating configurations of a movable electrode and a fixed electrode according to a modification example 1.

FIG. 10 is a cross-sectional view on arrow along the line in FIG. 9.

FIG. 11 is a schematic plan view illustrating configurations of a movable electrode and a fixed electrode according to a modification example 2.

FIG. 12 is a cross-sectional view on arrow along the IV-IV line in FIG. 11.

MODES FOR CARRYING OUT THE INVENTION

In the following, embodiments of the disclosure will be described in detail with reference to the drawings. Incidentally, the order of description is as follows.

1. First Embodiment (an example of an MEMS switch in which high-resistance regions are provided in selective regions of respective facing surfaces of a movable electrode and a fixed electrode and a projection is provided on the fixed electrode)

2. Second Embodiment (an example of an MEMS switch in which the respective facing surfaces of the movable electrode and the fixed electrode have semiconductor regions of mutually different conductivity types)

3. Modification Example 1 (an example of an MEMS switch in which the high-resistance regions are provided on the respective facing surfaces of the movable electrode and the fixed electrode and configured such that the respective facing surfaces are made nonparallel to each other)

4. Modification Example 2 (an example of an MEMS switch in which the semiconductor regions of mutually different conductivity types are provided on the respective facing surfaces of the movable electrode and the fixed electrode and configured such that the respective facing surfaces are made nonparallel to each other)

First Embodiment

[Configuration]

FIG. 1 schematically illustrates an X-Y planar configuration of an MEMS switch (an MEMS switch 1) according to the first embodiment of the disclosure. The MEMS switch 1 is a so-called bulk MEMS type electrostatic drive type switch and includes an electrostatic drive type actuator (a driver 1A) and a contact part (a contact part 1B). The MEMS switch 1 is provided with a voltage application unit 16 adapted to drive the driver 1A (adapted to apply a voltage between a movable electrode 12 and a fixed electrode 11).

The driver 1A is provided with the fixed electrode 11 and the movable electrode 12 and generates the electrostatic attraction (driving force) by giving a potential difference between these fixed electrode 11 and movable electrode 12. The movable electrode 12 is displaced by this electrostatic attraction. In addition, when the potential difference is brought back to zero, the movable electrode 12 is returned to its original position by return force derived from a return spring 120 coupled to the movable electrode 12. An ON state and an OFF state are switched by utilizing these two movements to be operated as a switch.

In the bulk MEMS, the movable electrode 12 and the fixed electrode 11 are formed in, for example, a cavity of a not illustrated base member (a base). These movable electrode 12 and fixed electrode 11 are held in a state of floating from a bottom surface in the base. In many cases, for example, an SOI (Silicon on Insulator) substrate is used as the base. It is possible to form the movable electrode 12 and the fixed electrode 11 by deeply digging an active layer (monocrystalline Si) of the SOI substrate by, for example, dry etching and thereafter selectively etching a BOX layer (a silicon oxide film).

The base may be configured by Si-based semiconductors such as those made of, for example, silicon (Si), silicon carbide (SiC), silicon germanium (SiGe) or silicon-germanium-carbon (SiGeC) other than the above-described SOI substrate.

The fixed electrode 11 is fixed to the base and is disposed facing the movable electrode 12 in a state of being separated from the movable electrode 12 in a moving direction (for example, a Y direction) of the movable electrode 12. The fixed electrode 11 is formed so as to have, for example, a pectinate shape as a whole. The fixed electrode 11 and the movable electrode 12 may be desirably formed thin and long in order to more largely ensure areas of facing surfaces 11A and 12A.

The movable electrode 12 is movable relative to the base and is held to be displaceable in a predetermined direction (for example, the Y direction). The movable electrode 12 is held to the base via a fixing member 15 (an anchor) and the return spring 120. The return spring 120 extends in, for example, an X direction and is supported by the fixing member 15 at both ends. The movable electrode 12 is linked to a portion of this return spring 120. Two return springs 120 are provided so as to, for example, sandwich the movable electrode 12 between them. The movable electrode 12 has a shaft 121 that extends in, for example, the Y direction and has the pectinate shape as a whole with a plurality of electrode portions projecting from the shaft 121. Arrangement is made such that the pectinate shape of the movable electrode 12 meshes with the pectinate shape of the fixed electrode 11. The contact part 1B is provided on the other-end side of the shaft 121.

The contact part 1B includes a contact 13 that so moves as to follow the movable electrode 12 (the shaft 121), an input line 14A, and an output line 14B. The contact 13 is, for example, disposed facing each of the input line 14A and the output line 14B and is configured that its states of contact with or noncontact to the input line 14A and the output line 14B are switched by displacement of the movable electrode 12.

(Detailed Configurations of Fixed Electrode 11 and Movable Electrode 12)

FIG. 2A illustrates, in an enlarged fashion, portions of the fixed electrode 11 and the movable electrode 12. FIG. 2B is a cross-sectional view on arrow along the I-I line in FIG. 2A. The fixed electrode 11 and the movable electrode 12 include semiconductors (for example, silicon and so forth) that are able to change electric resistivities thereof by impurity diffusion.

In the present embodiment, high resistance regions (high-resistance regions 11a1 and 12a1) are formed in at least portions of the respective facing surfaces (the facing surfaces 11A and 12A) of these fixed electrode 11 and movable electrode 12. Here, the high-resistance regions 11a1 and 12a1 are formed in both of the facing surface 11A of the fixed electrode 11 which faces the movable electrode 12 and the facing surface 12A of the movable electrode 12 which faces the fixed electrode 11 so as to face each other.

The high-resistance regions 11a1 and 12a1 are regions that are high in electric resistance (regions that are locally high in electric resistance) in comparison with surrounding regions thereof (the regions around the high-resistance regions 11a1 and 12a1 of the fixed electrode 11 and the movable electrode 12), and are so configured as to be lower in impurity concentration than the surrounding regions. It is possible to form such high-resistance regions 11a1 and 12a1 by doping impurities while masking portions of the facing surfaces 11A and 12A. Here, although in the ON state of the MEMS switch 1, the respective facing surfaces of the movable electrode 12 and the fixed electrode 11 partially or entirely come into contact with each other (or come close to each other), the high-resistance regions 11a1 and 12a1 may be desirably formed in local portions corresponding to the above-described contact portions. In addition, the high-resistance regions 11a1 and 12a1 are formed in, for example, upper-side local regions in a Y-Z cross-section as illustrated in FIG. 2B.

A projection (a projection 11a2) is provided on one or both of the facing surfaces 11A and 12A of the fixed electrode 11 and the movable electrode 12. Here, the projection 11a2 is provided on the facing surface 11A of the fixed electrode 11. In addition, the high-resistance region 11a1 is desirably formed in a local region including the projection 11a2 (around the projection 11a2) in planar view (on an X-Y plane). The projection 11a2 may project at least partially in a depth direction (in a Z direction) as illustrated in FIG. 2B. Here, the projection 11a2 has a tapered shape in the Y-Z cross-section and an extent of projection is larger on an upper portion than on a lower portion. It is possible to form such a shape of the projection 11a2 by controlling an etching condition in dry etching. It is desirable that a maximum value of a height (a projection amount) of the projection 11a2 be smaller than a distance between the fixed electrode 11 and the movable electrode 12, and that a tip of the projection 11a2 and the facing surface 12A of the movable electrode 12 be separated from each other in the OFF state. Incidentally, here, although the projection 11a2 is formed only on the fixed electrode 11 side, the projections may be formed on both of the fixed electrode 11 and the movable electrode 12. Alternatively, it may be formed only on the movable electrode 12 side.

Positions, areas (sizes), the numbers and so forth of the high-resistance regions 11a1 and 12a1 and the projections 11a2 are not limited to those illustrated in FIG. 2A and FIG. 2B. Although details will be described later, when the fixed electrode 11 and the movable electrode 12 come into contact with each other, the leakage current at the contact portions thereof changes in accordance with the number of the projections 11a2, the areas of the high-resistance regions 11a1 and 12a1, the resistivities, contact resistances or operating voltages of the high-resistance regions 11a1 and 12a1 and so forth. The number of the projections 11a2 thereon, the areas of the high-resistance regions 11a1 and 12a1, the resistivities of the high-resistance regions 11a1 and 12a1 and so forth may be desirably set such that the leakage current does not exceed a permissible upper limit value thereof. In addition, there is no particular limit on the shapes of the high-resistance regions 11a1 and 12a1 and the projections 11a2.

[Workings and Effects]

In the MEMS switch 1 according to the present embodiment, when the voltage is applied between the fixed electrode 11 and the movable electrode 12, the movable electrode 12 moves in the Y direction within a predetermined range by the electrostatic force (the movable electrode 12 moves close to or away from the fixed electrode 11). The states of contact and noncontact between the contact 13 and the input and the output lines 14A and 14B are switched by displacing the movable electrode 12 at a predetermined timing. FIG. 3A illustrates the OFF state of the MEMS switch 1 and FIG. 3B illustrates the ON state of the MEMS switch 1 schematically. ON operation and OFF operation of the MEMS switch 1 are performed in this way.

However, when the voltage is applied between the fixed electrode 11 and the movable electrode 12 and the movable electrode 12 is displaced, an electrode interval is narrowed. There is a tendency that the fixed electrode 11 and the movable electrode 12 are formed thin and long in order to largely ensure the areas of the facing surfaces 11A and 12A. For this reason, it sometimes occurs that a stress is imparted by the electrostatic attraction and a deflection occurs in the movable electrode 12, for example, as schematically illustrated in FIG. 4. The electrode interval becomes narrower than a designed value caused by this deflection and the fixed electrode 11 and the movable electrode 12 locally come into contact with each other and the so-called sticking occurs (X1 in FIG. 4). As a result, when the MEMS switch 1 is switched from the OFF state to the ON state and a signal line current (I1) flows, a leakage current (Ix) is generated and a current consumption is increased as illustrated in FIG. 5. In addition, the sticking lowers the reliability as well.

In contrast, in the present embodiment, the high-resistance regions 11a1 and 12a1 are formed in at least the portions of the respective facing surfaces (the facing surfaces 11A and 12A) of the fixed electrode 11 and the movable electrode 12. Owing to this, even in a case where the movable electrode 12 and the fixed electrode 11 have come into contact with each other, contact via the high-resistance regions 11a1 and 12a1 is made and it is difficult for the leakage current to flow through the contact portions concerned.

In particular, there are effects as follows by forming one or both of these high-resistance regions 11a1 and 12a1 (here, the high-resistance region 11a1) in the region including the projection 11a2 (by forming the high-resistance region 11a1 around the projection 11a2). That is, the contact occurs with ease at the tip portion of the projection 11a2 owing to provision of the projection 11a2 on the facing surface 11A (FIG. 6). The possibility that the sticking may occur is more reduced than in a case where there is no projection 11a2 by limiting the contact portion to the tip of the projection 11a2. In addition, since the surrounding of the projection 11a2 is higher in resistance than other portions, it is possible to suppress the leakage current that flows through the fixed electrode 11 and the movable electrode 12. Here, it is possible to suppress the leakage current also by making the fixed electrode 11 and the movable electrode 12 highly resistive not partially but entirely. However, in this case, a charging time of carriers to be supplied between the electrodes becomes long, causing a reduction in switching speed. In contrast, in the present embodiment, it is possible to limit the contact portions owing to the provision of the projection 11a2 and it is possible to form the high-resistance regions 11a1 and 12a1 only in effective regions corresponding to the contact portions. Accordingly, it is possible to suppress the leakage current without sacrificing the switching speed.

In the present embodiment, even in a case where the contact between the electrodes has occurred, it is possible to suppress the leakage current caused by the contact in this way. Therefore, it becomes possible to more reduce the distance between the movable electrode 12 and the fixed electrode 11 and to increase the number of the electrodes. That is, the miniaturization of the electrode becomes possible. Accordingly, it becomes possible to achieve the low-voltage driving without increasing the device size.

As described above, in the present embodiment, at least the portions of the respective facing surfaces of the movable electrode 12 and the fixed electrode 11 are formed with the high-resistance regions 11a1 and 12a1 that are lower in impurity concentration than the surrounding regions thereof. When the voltage is applied between the movable electrode 12 and the fixed electrode 11 in such a configuration, the movable electrode 12 is displaced in the Y direction by the electrostatic force thereof (the driving force is generated). On this occasion, even in a case where the movable electrode 12 and the fixed electrode 11 have come into contact with each other, the contact via the high-resistance regions 11a1 and 12a1 is made and it is possible to suppress the leakage current that is generated through the contact portions thereof. Since even in a case where the contact between the electrodes has occurred, it is possible to suppress the leakage current caused by the contact in this way, it becomes possible to more reduce the distance between the movable electrode 12 and the fixed electrode 11 and to increase the number of the electrodes (the miniaturization of the electrode becomes possible). Accordingly, it becomes possible to achieve the low-voltage driving without increasing the device size.

Instead, it is also possible to reduce the device size without increasing the drive voltage. This leads to a reduction in manufacturing cost of the device. In addition, since it is possible to suppress occurrence of the sticking, it becomes possible to improve the reliability. Incidentally, it is possible to obtain similar effects also in an electrostatic drive type MEMS resonator.

In the following, other embodiments and modification examples of the MEMS device according to the above-described first embodiment will be described. Incidentally, the same symbols are assigned to constitutional elements similar to those in the above-described first embodiment and description thereof is appropriately omitted.

Second Embodiment

FIG. 7 illustrates, in an enlarged fashion, portions of the fixed electrode 11 and the movable electrode 12 in the MEMS switch according to the second embodiment of the disclosure. FIG. 8 is a cross-sectional view on arrow along the II-II line in FIG. 7. The MEMS switch according to the present embodiment is the so-called bulk MEMS type electrostatic drive type switch similarly to that in the above-described first embodiment, and a basic configuration that includes the driver 1A configured by the electrostatic drive type actuator and the contact part 1B as illustrated in FIG. 1 is similar to that of the above-described first embodiment.

In addition, the fixed electrode 11 and the movable electrode 12 include semiconductors (for example, silicon and so forth) that are able to change the electric resistivities thereof by impurity diffusion. In addition, the projection 11a2 is provided on one or both of the facing surfaces 11A and 12A (here, the facing surface 11A) of the fixed electrode 11 and the movable electrode 12.

However, in the present embodiment, the fixed electrode 11 and the movable electrode 12 include semiconductors of mutually different conductivity types unlike those of the above-described first embodiment. For example, the fixed electrode 11 and the movable electrode 12 respectively include an n-type semiconductor and a p-type semiconductor. Describing in detail, the movable electrode 12 includes the p-type semiconductor in at least a portion of the facing surface 12A that faces the fixed electrode 11, and the fixed electrode 11 includes the n-type semiconductor in a region, facing the above-described p-type semiconductor, of the facing surface 11A that faces the movable electrode 12. For example, as illustrated in FIG. 8, an n-type region 11b into which an n-type impurity is doped is formed in an upper-side region of the fixed electrode 11 and a p-type region 12b into which a p-type impurity is doped is formed in an upper-side region of the movable electrode 12. Formation of such a configuration is possible, for example, by doping mutually different impurities into the respective fixed electrode 11 and movable electrode 12 by using masks. The n-type region 11b and the p-type region 12b are desirably formed in portions in which the electrodes come into contact with each other (or come close to each other) when the MEMS switch 1 is in the ON state similarly to the high-resistance regions 11a1 and 12a1 in the above-described first embodiment.

Also in the present embodiment, when the voltage is applied between the fixed electrode 11 and the movable electrode 12, the movable electrode 12 moves in the Y direction within the predetermined range by the electrostatic force similarly to that in the above-described first embodiment. The OFF state and the ON state of the MEMS switch are changed over by displacing the movable electrode 12 at the predetermined timing. However, in the ON state, the electrodes come into contact with each other by the deflection of the movable electrode 12 and the sticking occurs as described above. As a result, the leakage current is generated and the current consumption is increased. In addition, the sticking reduces the reliability as well.

In contrast, in the present embodiment, the fixed electrode 11 includes the n-type semiconductor and the movable electrode 12 includes the p-type semiconductor. Therefore, even in a case where the movable electrode 12 and the fixed electrode 11 have come into contact with each other, the p-type semiconductor and the n-type semiconductor come into contact with each other on the contacts portions thereof and the p-n junction diode is formed. Therefore, it becomes difficult for the current to flow from the fixed electrode 11 side to the movable electrode 12 side. Thus, it becomes difficult for the leakage current to flow through the contact portions. Here, it is possible to suppress the leakage current also by making the entire of the fixed electrode 11 and the movable electrode 12 highly resistive. However, in this case, the charging time of the carriers to be supplied between the electrodes becomes long, causing a reduction in switching speed. In the present embodiment, since the p-n junction is utilized as described above, it is possible to suppress the leakage current with the resistivities of the fixed electrode 11 and the movable electrode 12 being maintained low, that is, without sacrificing the switching speed. Incidentally, a direction that the potential difference is to be given may be reversed to allow for a configuration in which the fixed electrode 11 includes the n-type semiconductor and the movable electrode 12 includes the p-type semiconductor. Also in this case, it is possible to obtain the effects equivalent to the above-described ones.

In addition, it becomes easy for the contact to occur on the tip portion of the projection 11a2 by forming the projection 11a2 on the facing surface 11A of one or both of the fixed electrode 11 and the movable electrode 12 (here, the fixed electrode 11). The possibility that the sticking may occur is more reduced than in a case where there is no projection 11a2 by limiting the contact portion to the tip of the projection 11a2.

As described above, in the present embodiment, the movable electrode 12 includes the first conductivity type (for example, p-type) semiconductor in at least the portion of the facing surface 12A that faces the fixed electrode 11 and the fixed electrode 11 includes the second conductivity type (for example, n-type) semiconductor in the region, facing the first conductivity type (for example, p-type) semiconductor, of the facing surface 11A that faces the movable electrode 12. When the voltage is applied between the movable electrode 12 and the fixed electrode 11 in such a configuration, the movable electrode 12 is displaced in the first direction by the electrostatic force thereof (the driving force is generated). On this occasion, even in a case where the movable electrode 12 and the fixed electrode 11 have come into contact with each other, the p-n junction diode is formed at the contact portions thereof and it is possible to suppress the current leakage. Also in a case where the contact between the electrodes has occurred, it is possible to suppress the leakage current caused by the contact in this way. Therefore, it becomes possible to more reduce the distance between the movable electrode 12 and the fixed electrode 11 and to increase the number of the electrodes (the miniaturization of the electrode becomes possible). Accordingly, it becomes possible to achieve the low-voltage driving without increasing the device size.

Modification Example 1

FIG. 9 illustrates, in an enlarged fashion, portions of the fixed electrode 11 and the movable electrode 12 in the MEMS switch according to a modification example (a modification example 1) of the above-described first embodiment. FIG. 10 is a cross-sectional view on arrow along the line in FIG. 9. Although in the above-described first embodiment, the configuration that the projection 11a2 is provided is given by way of example, the projection 11a2 may not be provided. For example, a configuration may be made such that the respective facing surfaces 11A and 12A of the fixed electrode 11 and the movable electrode 12 become nonparallel to each other instead of providing the projection 11a2, as in the present modification example.

Although the movable electrode 12 and the fixed electrode 11 extend side by side in planar view, the facing surfaces 11A and 12A of the movable electrode 12 and the fixed electrode 11 are made nonparallel to each other in a cross-section (the Y-Z cross-section) orthogonal to the extending direction thereof (the X direction). In other words, the fixed electrode 11 and the movable electrode 12 have inversely tapered shapes in the Y-Z cross-section. Therefore, the distance between the facing surfaces 11A and 12A is made wider on the lower side (a distance d2) than on the upper side (a distance d1). It is possible to limit the contact portions only to respective upper portions of the fixed electrode 11 and the movable electrode 12 owing to this inversely tapered shape. It is possible to form such an inversely tapered shape by appropriately setting the etching condition in dry-etching.

High-resistance regions (high-resistance regions 11c and 12c) are formed in the facing surfaces 11A and 12A of these fixed electrode 11 and movable electrode 12 similarly to those in the above-described first embodiment. However, in the present modification example, the high-resistance regions 11c and 12c are formed in continuous regions in the extending direction (the X-direction) of the movable electrode 12 and the fixed electrode 11 on the X-Y plane. The high-resistance regions 11c and 12c are formed in, for example, upper-side local regions in the Y-Z cross-section as illustrated in FIG. 10. It is possible to form the high-resistance regions 11c and 12c by impurity doping using the masks similarly to the high-resistance regions 11a1 and 12a1 in the above-described first embodiment and the impurity concentrations thereof are relatively lowered.

The configuration may be also made such that the facing surfaces 11A and 12A of the fixed electrode 11 and the movable electrode 12 are made nonparallel to each other as in the present modification example. It is possible to obtain the effects equivalent to those of the above-described first embodiment also in the present modification example. In addition, since when the electrodes come into contact with each other, the contact portions are limited to the upper sides of the fixed electrode 11 and the movable electrode 12 owing to the inversely tapered shapes, it is difficult for the sticking to occur in comparison with a case where the facing surfaces 11A and 12A are parallel with each other. In addition, since the resistivity of the surroundings of the contact portions is high, it is possible to suppress the leakage current that flows via the fixed electrode 11 and the movable electrode 12 when coming into contact with each other. Although the leakage current is suppressed also by making the entire electrodes highly resistive, the charging time of the carriers to be supplied between the electrodes for an original switching operation becomes long, causing a reduction in switching speed. Since, in the present modification example, only the surroundings of the contact portions (only upper-side regions of the electrodes) are made highly resistive, it is possible to suppress the leakage current without sacrificing the switching speed.

Modification Example 2

FIG. 11 illustrates, in an enlarged fashion, portions of the fixed electrode 11 and the movable electrode 12 in the MEMS switch according to a modification example (a modification example 2) of the above-described second embodiment. FIG. 12 is a cross-sectional view on arrow along the IV-IV line in FIG. 11. Although in the above-described second embodiment, the configuration that the projection 11a2 is provided is given by way of example, the projection 11a2 may not be provided. For example, a configuration may be made such that the respective facing surfaces 11A and 12A of the fixed electrode 11 and the movable electrode 12 become nonparallel to each other instead of providing the projection 11a2, as in the present modification example.

Although the movable electrode 12 and the fixed electrode 11 extend side by side in planar view, the facing surfaces 11A and 12A of the movable electrode 12 and the fixed electrode 11 are nonparallel to each other in the cross-section (the Y-Z cross-section) orthogonal to the extending direction thereof (the X direction). In other words, the fixed electrode 11 and the movable electrode 12 have the inversely tapered shapes in the Y-Z cross-section. Therefore, the distance between the facing surfaces 11A and 12A is made wider on the lower side (the distance d2) than on the upper side (the distance d1). It is possible to limit the contact portions only to the respective upper portions of the fixed electrode 11 and the movable electrode 12 owing to this inversely tapered shape. It is possible to form such an inversely tapered shape by appropriately setting the etching condition in dry-etching.

The fixed electrode 11 includes the n-type semiconductor (the n-type region 11b) similarly to that in the above-described second embodiment and the movable electrode 12 includes the p-type semiconductor (the p-type region 12b) similarly to that in the above-described second embodiment. The n-type region 11b and the p-type region 12b are formed in, for example, the upper-side local regions in the Y-Z cross-section as illustrated in FIG. 12. It is possible to form the n-type region 11b and the p-type region 12b by doping the mutually different impurities by using the masks similarly to those in the above-described second embodiment.

A configuration may be made such that the facing surfaces 11A and 12A of the fixed electrode 11 and the movable electrode 12 become nonparallel to each other as in the present modification example. It is possible to obtain the effects equivalent to those of the above-described second embodiment also in the present modification example. In addition, since when the electrodes come into contact with each other, the contact portions are limited to the upper sides of the fixed electrode 11 and the movable electrode 12 owing to the inversely tapered shapes thereof, it is difficult for the sticking to occur in comparison with the case where the facing surfaces 11A and 12A are parallel with each other. In addition, the p-n junction diode is formed around the contact portions and it is possible to suppress the leakage current that flows via the fixed electrode 11 and the movable electrode 12. Although the leakage current is suppressed also by making the entire electrodes highly resistive, the charging time of the carriers to be supplied between the electrodes for the original switching operation becomes long, causing a reduction in switching speed. In the present modification example, it is possible to suppress the leakage current without sacrificing the etching speed by utilizing the p-n junction.

Incidentally, although the configurations that both of the facing surface 11A of the fixed electrode 11 and the facing surface 12A of the movable electrode 12 have the inversely tapered shapes in the Y-Z cross-section are exemplified in the above-described modification examples 1 and 2, only one of the facing surfaces 11A and 12A may have the inversely tapered shape. If the facing surfaces 11A and 12A are nonparallel to each other, the contact portions will be limited and therefore it is possible to obtain the above-described effects.

Although, in the foregoing, the embodiments and the modification examples have been described, the contents of the disclosure are not limited to the above-described embodiments and so forth and various modifications are possible. For example, although description has been made by giving the MEMS switch using the electrostatic actuator by way of example in the above-described embodiments and so forth, it is possible to apply the movable electrode and the fixed electrode of the disclosure also to an acceleration sensor, a gyroscope sensor, and so forth other than the above.

In addition, the shapes, the sizes, the positions, the numbers and so forth of the movable electrode, the fixed electrode, the projection, the high-resistance region and so forth of the disclosure are not limited to the above-described ones and various modifications are possible. Appropriate shapes and so forth may be set in accordance with the specification of the device.

In addition, the effects described in the above-described embodiments and so forth are merely one example. Effects may be other effects, or may further contain other effects.

Incidentally, the disclosure may also have such configurations as follows.

(1)
An electrostatic actuator including:
a base;
a movable electrode including a semiconductor and supported to the base to be displaceable in a first direction;
a fixed electrode including the semiconductor and fixed to the base, the fixed electrode facing the movable electrode in a state of being separated therefrom in the first direction; and
a high-resistance region formed in at least a portion of each of respective facing surfaces of the movable electrode and the fixed electrode, and lower in impurity concentration than a surrounding region thereof.

(2)
The electrostatic actuator according to (1), in which
the respective facing surfaces of the movable electrode and the fixed electrode partially or entirely come into contact with or come close to each other by electrostatic force generated when a voltage is applied between the movable electrode and the fixed electrode, and
the high-resistance region is formed in a portion in which the movable electrode and the fixed electrode come into contact with or come close to each other.

(3)
The electrostatic actuator according to (1) or (2), further including a projection provided on one or both of the respective facing surfaces of the movable electrode and the fixed electrode.

(4)
The electrostatic actuator according to (3), in which the high-resistance region is formed in, in a planar view, a local region that includes the projection.

(5)
The electrostatic actuator according to any one of (1) to (4), in which
the movable electrode and the fixed electrode extend side by side in a planar view, and
the respective facing surfaces of the movable electrode and the fixed electrode are nonparallel to each other in a cross-section that is orthogonal to an extending direction thereof.

(6)
The electrostatic actuator according to (5), in which the high-resistance region is formed in a continuous region that is along the extending direction.

(7)
An electrostatic actuator including:
a base;
a movable electrode including a semiconductor and supported to the base to be displaceable in a first direction; and
a fixed electrode including a semiconductor and fixed to the base, the fixed electrode facing the movable electrode in a state of being separated therefrom in the first direction,
the movable electrode including a first conductivity type semiconductor in at least a portion of a facing surface that faces the fixed electrode, and
the fixed electrode including a second conductivity type semiconductor in a region, facing the first conductivity type semiconductor, of a facing surface that faces the movable electrode.

(8)
The electrostatic actuator according to (7), in which
the respective facing surfaces of the movable electrode and the fixed electrode partially or entirely come into contact with or come close to each other by electrostatic force generated when a voltage is applied between the movable electrode and the fixed electrode, and
the first conductivity type semiconductor and the second conductivity type semiconductor are formed in respective portions in which the movable electrode and the fixed electrode come into contact with or come close to each other.

(9)
The electrostatic actuator according to (7) or (8), further including a projection provided on one or both of the respective facing surfaces of the movable electrode and the fixed electrode.

(10)
The electrostatic actuator according to any one of (7) to (9), in which
the movable electrode and the fixed electrode extend side by side in a planar view, and
the respective facing surfaces of the movable electrode and the fixed electrode are nonparallel to each other in a cross-section that is orthogonal to an extending direction thereof.

(11)
A switch provided with an electrostatic actuator, the electrostatic actuator including:
a base;
a movable electrode including a semiconductor and supported to the base to be displaceable in a first direction;
a fixed electrode including the semiconductor and fixed to the base, the fixed electrode facing the movable electrode in a state of being separated therefrom in the first direction; and
a high-resistance region formed in at least a portion of each of respective facing surfaces of the movable electrode and the fixed electrode, and lower in impurity concentration than a surrounding region thereof.

(12)
A switch provided with an electrostatic actuator, the electrostatic actuator including:
a base;
a movable electrode including a semiconductor and supported to the base to be displaceable in a first direction; and
a fixed electrode including a semiconductor and fixed to the base, the fixed electrode facing the movable electrode in a state of being separated therefrom in the first direction,
the movable electrode including a first conductivity type semiconductor in at least a portion of a facing surface that faces the fixed electrode, and
the fixed electrode including a second conductivity type semiconductor in a region, facing the first conductivity type semiconductor, of a facing surface that faces the movable electrode.

The present application is based on and claims priority from Japanese Patent Application No. 2015-016773 filed with the Japan Patent Office on Jan. 30, 2015, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. An electrostatic actuator comprising:
a base;
a movable electrode including a semiconductor and supported to the base to be displaceable in a first direction;
a fixed electrode including the semiconductor and fixed to the base, the fixed electrode facing the movable electrode in a state of being separated therefrom in the first direction; and
a high-resistance region formed in at least a portion of each of respective facing surfaces of the movable electrode and the fixed electrode, and lower in impurity concentration than a surrounding region thereof.

2. The electrostatic actuator according to claim 1, wherein
the respective facing surfaces of the movable electrode and the fixed electrode partially or entirely come into contact with or come close to each other by electrostatic force generated when a voltage is applied between the movable electrode and the fixed electrode, and
the high-resistance region is formed in a portion in which the movable electrode and the fixed electrode come into contact with or come close to each other.

3. The electrostatic actuator according to claim 1, further comprising a projection provided on one or both of the respective facing surfaces of the movable electrode and the fixed electrode.

4. The electrostatic actuator according to claim 3, wherein the high-resistance region is formed in, in a planar view, a local region that includes the projection.

5. The electrostatic actuator according to claim 1, wherein
the movable electrode and the fixed electrode extend side by side in a planar view, and
the respective facing surfaces of the movable electrode and the fixed electrode are nonparallel to each other in a cross-section that is orthogonal to an extending direction thereof.

6. The electrostatic actuator according to claim 5, wherein the high-resistance region is formed in a continuous region that is along the extending direction.

7. An electrostatic actuator comprising:
a base;
a movable electrode including a semiconductor and supported to the base to be displaceable in a first direction; and
a fixed electrode including a semiconductor and fixed to the base, the fixed electrode facing the movable electrode in a state of being separated therefrom in the first direction,
the movable electrode including a first conductivity type semiconductor in at least a portion of a facing surface that faces the fixed electrode, and
the fixed electrode including a second conductivity type semiconductor in a region, facing the first conductivity type semiconductor, of a facing surface that faces the movable electrode.

8. The electrostatic actuator according to claim 7, wherein
the respective facing surfaces of the movable electrode and the fixed electrode partially or entirely come into contact with or come close to each other by electrostatic force generated when a voltage is applied between the movable electrode and the fixed electrode, and
the first conductivity type semiconductor and the second conductivity type semiconductor are formed in respective portions in which the movable electrode and the fixed electrode come into contact with or come close to each other.

9. The electrostatic actuator according to claim 7, further comprising a projection provided on one or both of the respective facing surfaces of the movable electrode and the fixed electrode.

10. The electrostatic actuator according to claim 7, wherein
the movable electrode and the fixed electrode extend side by side in a planar view, and
the respective facing surfaces of the movable electrode and the fixed electrode are nonparallel to each other in a cross-section that is orthogonal to an extending direction thereof.

11. A switch provided with an electrostatic actuator, the electrostatic actuator comprising:
a base;
a movable electrode including a semiconductor and supported to the base to be displaceable in a first direction;
a fixed electrode including the semiconductor and fixed to the base, the fixed electrode facing the movable electrode in a state of being separated therefrom in the first direction; and
a high-resistance region formed in at least a portion of each of respective facing surfaces of the movable electrode and the fixed electrode, and lower in impurity concentration than a surrounding region thereof.

12. A switch provided with an electrostatic actuator, the electrostatic actuator comprising:
a base;
a movable electrode including a semiconductor and supported to the base to be displaceable in a first direction; and
a fixed electrode including a semiconductor and fixed to the base, the fixed electrode facing the movable electrode in a state of being separated therefrom in the first direction,
the movable electrode including a first conductivity type semiconductor in at least a portion of a facing surface that faces the fixed electrode, and
the fixed electrode including a second conductivity type semiconductor in a region, facing the first conductivity type semiconductor, of a facing surface that faces the movable electrode.

* * * * *